US012622322B2

(12) United States Patent
Lee

(10) Patent No.: US 12,622,322 B2
(45) Date of Patent: May 5, 2026

(54) SEMICONDUCTOR PACKAGE HAVING ORDERED WIRE ARRANGEMENT BETWEEN DIFFERENTIAL PAIR CONNECTION PADS

(71) Applicant: SK hynix Inc., Icheon-si (KR)

(72) Inventor: Ki Yong Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 631 days.

(21) Appl. No.: 17/897,863

(22) Filed: Aug. 29, 2022

(65) Prior Publication Data

US 2023/0299051 A1 Sep. 21, 2023

(30) Foreign Application Priority Data

Mar. 18, 2022 (KR) ........................ 10-2022-0034159

(51) Int. Cl.
*H01L 25/065* (2023.01)
*H01L 23/00* (2006.01)
*H01L 23/498* (2006.01)

(52) U.S. Cl.
CPC .... *H01L 25/0657* (2013.01); *H01L 23/49811* (2013.01); *H01L 24/05* (2013.01); *H01L 2224/04042* (2013.01); *H01L 2224/48147* (2013.01); *H01L 2224/48227* (2013.01); *H01L 2225/06506* (2013.01); *H01L 2225/0651* (2013.01); *H01L 2225/06562* (2013.01)

(58) Field of Classification Search
CPC ....... H01L 25/0657; H01L 2224/04042; H01L 2225/06506; H01L 2225/0651; H01L 2224/08145; H01L 2223/6638; H01L 25/043; H01L 25/0652; H01L 25/071; H01L 25/074; H01L 25/0756; H01L 25/112; H01L 25/117; H01L 2224/48145–48149; H01L 2224/48227; H10D 88/00; H10D 88/01
See application file for complete search history.

(56) References Cited

U.S. PATENT DOCUMENTS

| | | | |
|---|---|---|---|
| 2007/0018293 A1 | 1/2007 | Sutardja |
| 2010/0032818 A1 | 2/2010 | Pilling et al. |
| 2010/0120198 A1 | 5/2010 | Appel et al. |
| 2013/0134579 A1 | 5/2013 | Howard et al. |

FOREIGN PATENT DOCUMENTS

KR 20150120617 A * 10/2015 ......... G11C 29/1201

* cited by examiner

*Primary Examiner* — Wael M Fahmy
*Assistant Examiner* — Fernando Jose Ramos-Diaz
(74) *Attorney, Agent, or Firm* — WILLIAM PARK AND ASSOCIATES LTD.

(57) ABSTRACT

A semiconductor package includes a package substrate, first and second semiconductor chips stacked on the package substrate and wire-bonded to the package substrate. The first semiconductor chip includes first differential pair signal pads, a first option signal pad, and a first signal path control circuit. The second semiconductor chip includes second differential pair signal pads, a second option signal pad, and a second signal path control circuit. The first signal path control circuit changes a signal path of one of the differential pair signals of the first semiconductor chip by a first control signal. The second signal path control circuit changes a signal path of one of the differential pair signals of the second semiconductor chip by a second control signal.

20 Claims, 11 Drawing Sheets

SEMICONDUCTOR PACKAGE HAVING ORDERED WIRE ARRANGEMENT BETWEEN DIFFERENTIAL PAIR CONNECTION PADS

CROSS-REFERENCE TO RELATED APPLICATION

The present application claims priority under 35 U.S.C 119(a) to Korean Application No. 10-2022-0034159, filed on Mar. 18, 2022, which is incorporated herein by reference in its entirety.

BACKGROUND

1. Technical Field

The present disclosure generally relates to a semiconductor package, and more particularly, to a semiconductor package including a semiconductor chip and a package substrate each having differential pair connection pads.

2. Related Art

As a semiconductor chip operates at a high speed, clock signals or data signals are transmitted through a differential mode signal transmission method in order to reduce the effect of noise. The differential mode signal transmission method may refer to a signal transmission method using two signal lines as a pair. In the differential mode signal transmission method, signals having the same magnitude and opposite phases may flow on the two signal lines. Specifically, a true signal and a complementary signal may be transmitted through the two signal lines. In this case, the complementary signal may be a signal having an opposite polarity to the true signal (i.e., a signal phase shifted by 180°).

When a plurality of semiconductor chips are stacked over a package substrate, there is a demand for designing signal traces of the package substrate to correspond to the differential mode signal transmission method of the semiconductor chip. Through efficient arrangement of wirings of the package substrate, the true signal and the complementary signal may be smoothly exchanged with an external system.

SUMMARY

A semiconductor package according to an embodiment of the present disclosure may include a package substrate, a first semiconductor chip disposed on the package substrate and wire-bonded to the package substrate, and a second semiconductor chip stacked on the first semiconductor chip and wire-bonded to the package substrate. The first semiconductor chip may include first differential pair signal pads, a first option signal pad disposed adjacent to the first differential pair signal pads, and a first signal path control circuit for controlling signal input/output of the first differential pair signal pads and the first option signal pad. The second semiconductor chip may include second differential pair signal pads, a second option signal pad disposed adjacent to the second differential pair signal pads, and a second signal path control circuit for controlling signal input/output of the second differential pair signal pads and the second option signal pad. The first signal path control circuit may change a signal path of one of the differential pair signals of the first semiconductor chip by a first control signal, and a pad to which the one of the differential pair signals reaches is changed from one signal pad of the first differential pair signal pads to the first option signal pad, along the changed path. The second signal path control circuit may change a signal path of one of the differential pair signals of the second semiconductor chip by a second control signal, and a pad to which one of the differential pair signals reaches is changed from one of the second differential pair signal pads to the second option signal pad along the changed path.

A semiconductor package according to an embodiment of the present disclosure may include a package substrate, and a semiconductor chip disposed on the package substrate and wire-bonded to the package substrate. The package substrate may include differential pair bond fingers disposed on a substrate body of the package substrate. The semiconductor chip may include differential pair signal pads disposed on a chip body of the semiconductor chip, an option signal pad disposed adjacent to the differential pair signal pads, a control signal pad disposed on the chip body to be spaced apart from the differential pair signal pads, and a signal path control circuit. The signal path control circuit may change a signal path between one of the differential pair signal lines of the semiconductor chip and the differential pair signal pads to a signal path between the one of the differential pair signal lines of the semiconductor chip and the option signal pad, according to electrical activation of the control signal pad.

BRIEF DESCRIPTION OF THE DRAWINGS

FIG. 1 is a plan view schematically illustrating an arrangement of pads of a semiconductor chip and a package substrate according to a comparative example.

FIG. 2 is a plan view schematically illustrating an arrangement of bonding wires connecting a semiconductor chip and a package substrate according to a comparative example.

FIG. 3 is a plan view schematically illustrating an arrangement of bonding wires connecting a semiconductor chip and a package substrate according to another comparative example.

FIGS. 10 and 11 are views schematically illustrating a signal path control circuit of a semiconductor chip according to an embodiment of the present disclosure.

DETAILED DESCRIPTION

Figure 4:
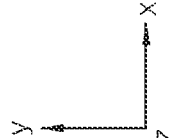
FIG. 4 is a plan view schematically illustrating a pad configuration of a semiconductor chip and a package substrate according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to one of ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise," "include," or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

In this specification, a semiconductor chip may mean that a semiconductor substrate on which electronic circuits are integrated is divided into different chip forms. Accordingly, the term "semiconductor chip" may be used to encompass not only the form in which the semiconductor substrate is cut into a chip form, but also the form in which separate semiconductor chip regions are formed on the semiconductor substrate even before the semiconductor substrate is cut and processed into the chip form.

A semiconductor chip may refer to a memory chip in which memory integrated circuits, such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processors, such as application processors (Aps), graphic processing units (GPUs), central processing units (CPUs) or system-on-chips (SoCs). Meanwhile, the semiconductor chip may be referred to as a semiconductor die.

The semiconductor package may include a printed circuit board on which the semiconductor chip is mounted. The printed circuit board may include at least one or more integrated circuit patterns, and may be referred to as a package substrate in the present specification. For communication between the package substrate and the semiconductor chip, a connection method such as wire bonding may be applied.

The semiconductor package may be applied to various electronic information processing devices, for example, information communication devices such as portable terminals, bio or health care related electronic devices, human wearable electronic devices, and the like.

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

Embodiments of the present disclosure disclose a semiconductor package including a semiconductor chip and a package substrate employing a differential mode signal transmission method. In this specification, differential pair signals may include a true signal and a complementary signal. The complementary signal may be the same signal having opposite polarity (i.e., a signal having a phase delayed by 180°) with respect to the true signal. Also, in this specification, the true signal and the complementary signal may be used as a relative concept to each other. Any one of the differential pair signals may be referred to as the true signal, and the other signal may be referred to as the complementary signal.

The differential pair signals may be transmitted through a pair of differential signal lines disposed adjacent to each other. The true signal may be transmitted through a true signal line between the pair of differential signal lines, and the complementary signal may be transmitted through a complementary signal line between the pair of differential signal lines. The pair of differential signal lines may be routed side by side at regular intervals. Through this, it is possible to improve the stability of signal transmission by reducing noise.

For convenience of description, in this specification, the true signal between the differential pair signals may be referred to as a signal having a positive polarity, and the complementary signal may be referred to as a signal having a negative polarity. Accordingly, in the drawings of the present disclosure, '+' may be indicated on a signal pad through which the true signal is transmitted between the differential pair signals, and '-' may be indicated on a signal pad through which the complementary signal is transmitted. However, the scope and spirit of the present disclosure are not necessarily limited thereto, and the true signal between the differential pair signals is referred to as a signal having a negative polarity. Even when the complementary signal is referred to as a signal having a positive polarity, substantially the same description of the configuration of the present disclosure is possible.

Figure 1:
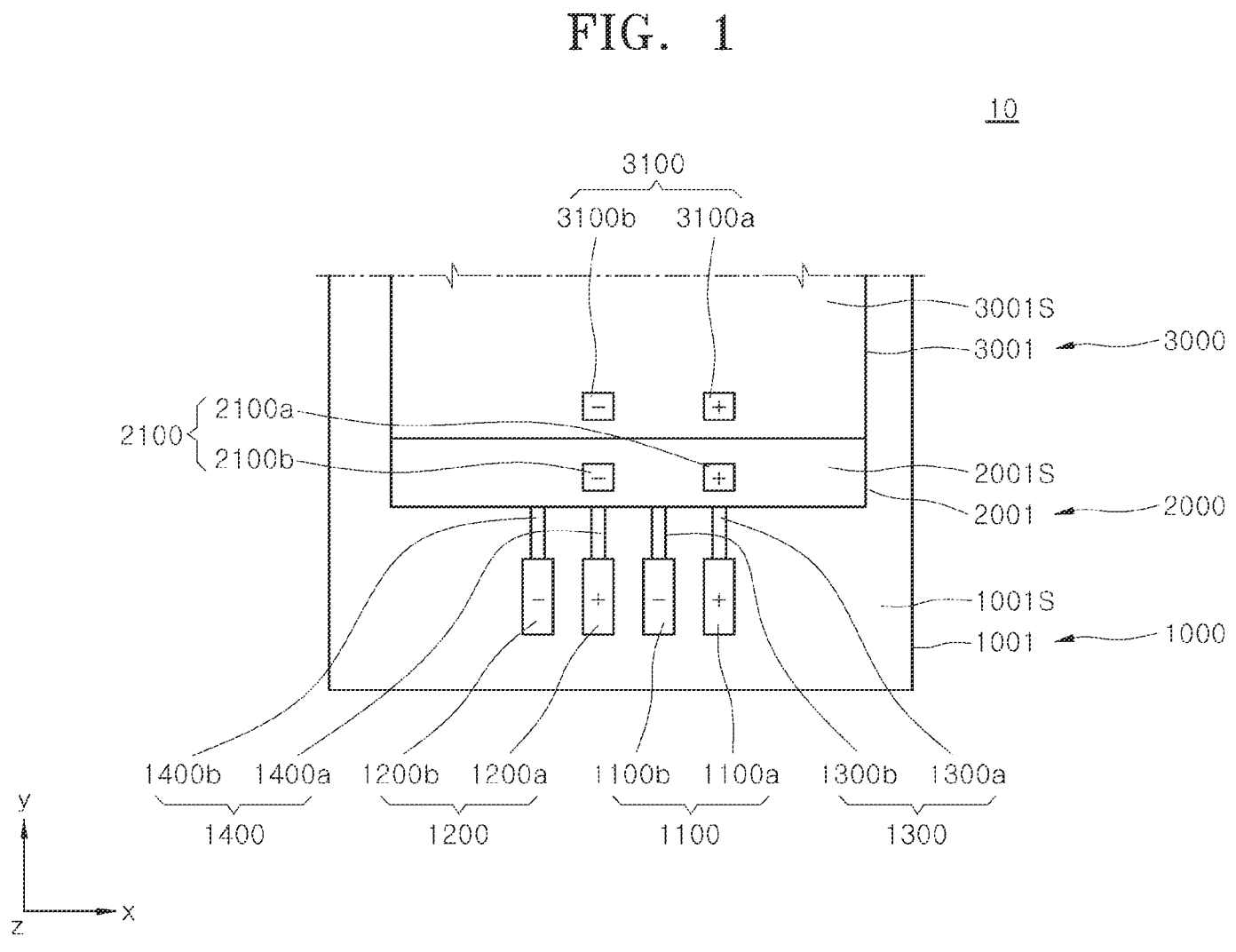
Figure 2:
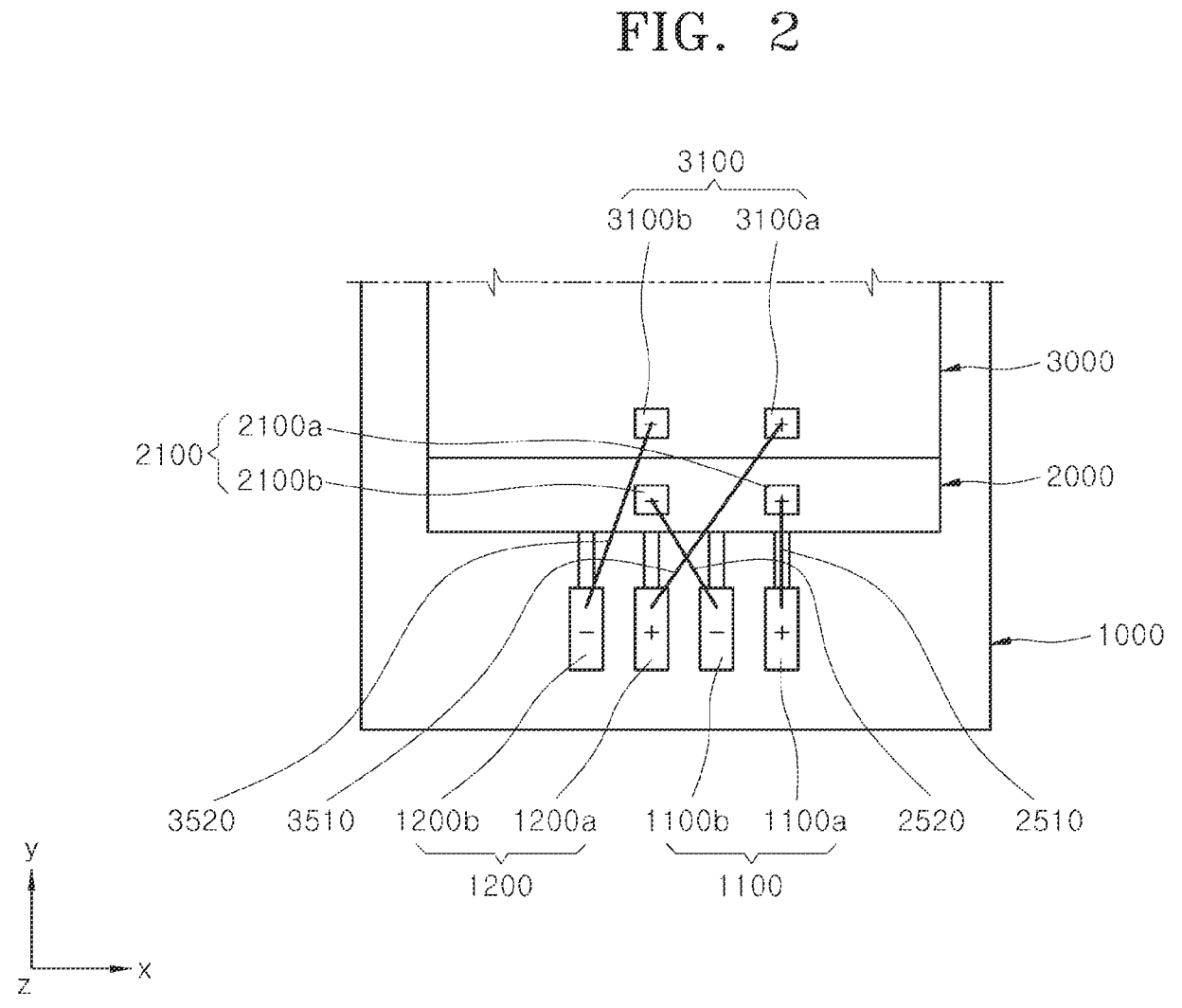
Figure 3:
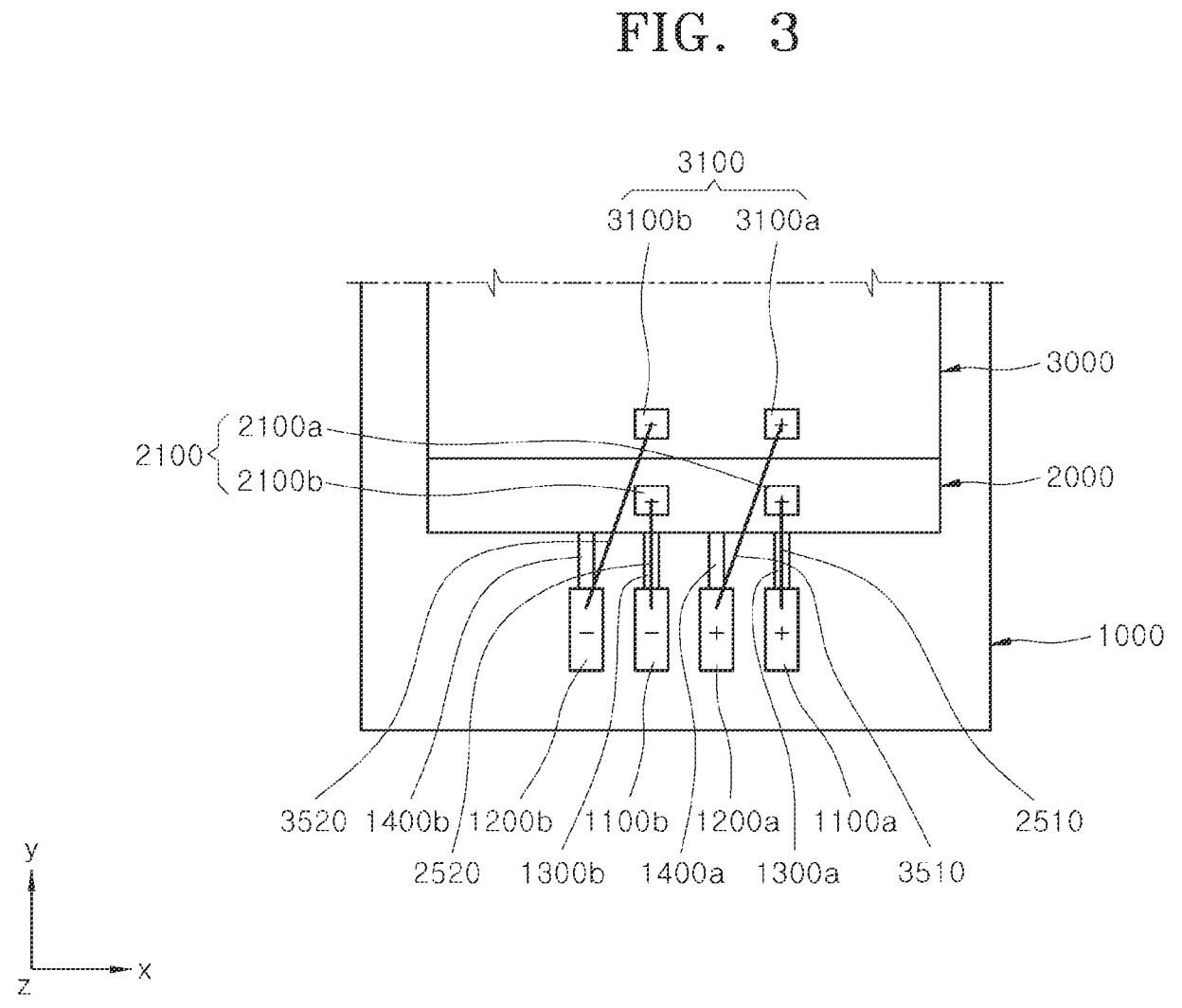

FIGS. 1 to 3 are plan views schematically illustrating a semiconductor package according to comparative examples. Specifically, FIG. 1 is a plan view schematically illustrating an arrangement of pads of a semiconductor chip and a package substrate according to a comparative example. FIG. 2 is a plan view schematically illustrating an arrangement of bonding wires connecting the semiconductor chip and the package substrate according to a comparative example. FIG. 3 is a plan view schematically illustrating an arrangement of bonding wires connecting the semiconductor chip and the package substrate, according to another comparative example.

Referring to FIG. 1, the semiconductor package 10 according to a comparative example may include a first semiconductor chip 2000 disposed on a package substrate 1000, and a second semiconductor chip 3000 stacked on the first semiconductor chip 2000. The second semiconductor chip 3000 may be stacked in a z-direction while being offset in a y-direction with respect to the first semiconductor chip 2000.

The package substrate 1000 may include a substrate body 1001. First and second differential pair bond fingers 1100 and 1200 may be disposed on a surface 1001S of the substrate body 1001. In addition, first and second differential pair signal traces 1300 and 1400 electrically connected to the first and second differential pair bond fingers 1100 and 1200, respectively, may be disposed on the surface 1001S of the substrate body 1001. The first and second differential pair signal traces 1300 and 1400 may be electrically connected to external connection structures disposed on an opposite surface of the surface 1001S of the substrate body 1001 through wirings (not shown) of the substrate body 1001. When the external connection structures of the package substrate 1000 communicate with an external system, the package substrate 1000 and the external system may exchange differential pair signals with each other.

The first differential pair bond fingers 1100 may include a first true signal bond finger 1100*a* and a first complementary signal bond finger 1100*b*. The first true signal bond finger 1100*a* and the first complementary signal bond finger 1100*b* may be disposed adjacent to each other. Similarly, the second differential pair bond fingers 1200 may include a second true signal bond finger 1200*a* and a second complementary signal bond finger 1200*b*. The second true signal bonding finger 1200*a* and the second complementary signal bonding finger 1200*b* may be disposed adjacent to each other.

The first differential pair signal traces 1300 may include a first true signal trace 1300*a* and a first complementary signal trace 1300*b* disposed adjacent to each other. Similarly, the second differential pair signal traces 1400 may include a second true signal trace 1400*a* and a second complementary signal trace 1400*b* disposed adjacent to each other. With the arrangement, first differential pair signals may be transmitted within the package substrate 1000 through the first differential pair signal traces 1300, and second differential pair signals may be transmitted within the package substrate 1000 through the second differential pair signal traces 1400.

The first semiconductor chip 2000 may include a first chip body 2001 including integrated circuits. First differential pair signal pads 2100 may be disposed on a surface 2001S of the first chip body 2001. The first differential pair signal pads 2100 may include a first true signal pad 2100*a* and a first complementary signal pad 2100*b*. Although not shown, first differential pair signal lines of the first semiconductor chip 2000 may be connected to the first differential pair signal pads 2100. As an example, a first true signal line of the first differential pair signal lines may be connected to the first true signal pad 2100*a*, and a first complementary signal line of the first differential pair signal lines may be connected to the first complementary signal pad 2100*b*.

The second semiconductor chip 3000 may include a second chip body 3001 including integrated circuits. Second differential pair signal pads 3100 may be disposed on a surface 3001S of the second chip body 3001. The second differential pair signal pads 3100 may include a second true signal pad 3100*a* and a second complementary signal pad 3100*b*. Although not shown, second differential pair signal lines of the second semiconductor chip 3000 may be connected to the second differential pair signal pads 3100. As an example, a second true signal line of the second differential pair signal lines may be connected to the second true signal pad 3100*a*, and a second complementary signal line of the second differential pair signal lines may be connected to the second complementary signal pad 3100*b*.

FIG. 2 schematically illustrates an arrangement of bonding wires between the semiconductor chips and the package substrate for transmitting differential pair signals according to a comparative example. Referring to FIG. 2, the first true signal pad 2100*a* of the first semiconductor chip 2000 may be bonded to the first true signal bond finger 1100*a* of the package substrate 1000 by a first true signal wire 2510. A first true signal may be transmitted through the first true signal wire 2510. The first complementary signal pad 2100*b* of the first semiconductor chip 2000 may be bonded to the first complementary signal bond finger 1100*b* of the package substrate 1000 by a first complementary signal wire 2520. A first complementary signal may be transmitted through the first complementary signal wire 2520.

In the same way, the second true signal pad 3100*a* of the second semiconductor chip 3000 may be bonded to the second true signal bond finger 1200*a* of the package substrate 1000 by a second true signal wire 3510. A second true signal may be transmitted through the second true signal wire 3510. The second complementary signal pad 3100*b* of the second semiconductor chip 2000 may be bonded to the second complementary signal bond finger 1200*b* of the package substrate 1000 by a second complementary signal wire 3520. A second complementary signal may be transmitted through the second complementary signal wire 3520.

Referring to FIG. 2, the first and second differential pair bond fingers 1100 and 1200 on the package substrate 1000 may be arranged more densely than the first and second differential pair signal pads 2100 and 3100 of the first and second semiconductor chips 2000 and 3000, respectively, along a direction (e.g., x-direction). Accordingly, at least two of the bonding wires formed for the differential pair signal transmission may cross each other. As an example, as shown in FIG. 2, the first complementary signal wire 2520 and the second true signal wire 3510 may cross each other. With such an arrangement, there is a risk that the first complementary signal wire 2520 and the second true signal wire 3510 come into contact with each other during a wire bonding process or a subsequent molding process. Accordingly, a signal error may occur due to the contact of the bonding wires during the operation of the semiconductor package.

FIG. 3 schematically illustrates an arrangement of bonding wires between the semiconductor chip and the package substrate for transmitting differential pair signals according to another comparative example. Referring to FIG. 3, unlike that shown in FIG. 2, the first and second true signal wires 2510 and 3510 and the first and second complementary signal wires 2520 and 3520 may be disposed so as not to cross each other. To this end, the arrangement of the first and second differential pair bond fingers 1100 and 1200 of the package substrate 1000 may be modified.

In the modified arrangement of the first and second differential pair bond fingers 1100 and 1200 shown in FIG. 3, the first and second differential pair bond fingers 1100 and 1200 are not arranged as a differential pair. The first true signal bond finger 1100*a* and the first complementary signal bond finger 1100*b* are not adjacent to each other, and the second true signal bonding finger 1200*a* and the second complementary signal bonding finger 1200*b* are not adjacent to each other.

In addition, according to the modified arrangement of the first and second differential pair bond fingers 1100 and 1200, the arrangement of the first and second differential pair signal traces 1300 and 1400 may also be modified. That is, the first true signal trace 1300*a* and the first complementary signal trace 1300*b* are not adjacent to each other, and the second true signal trace 1400*a* and the second complementary signal trace 1400*b* are not adjacent to each other.

Through the above-described arrangement of the bond fingers and signal traces, the differential pair signals cannot be transmitted in the package substrate 1000 in the differential mode signal transmission method. Accordingly, it is necessary to arrange a pair of corresponding true signal traces and complementary signal traces side by side on the package substrate 1000 through an additional design modification of the signal traces.

Figure 5:
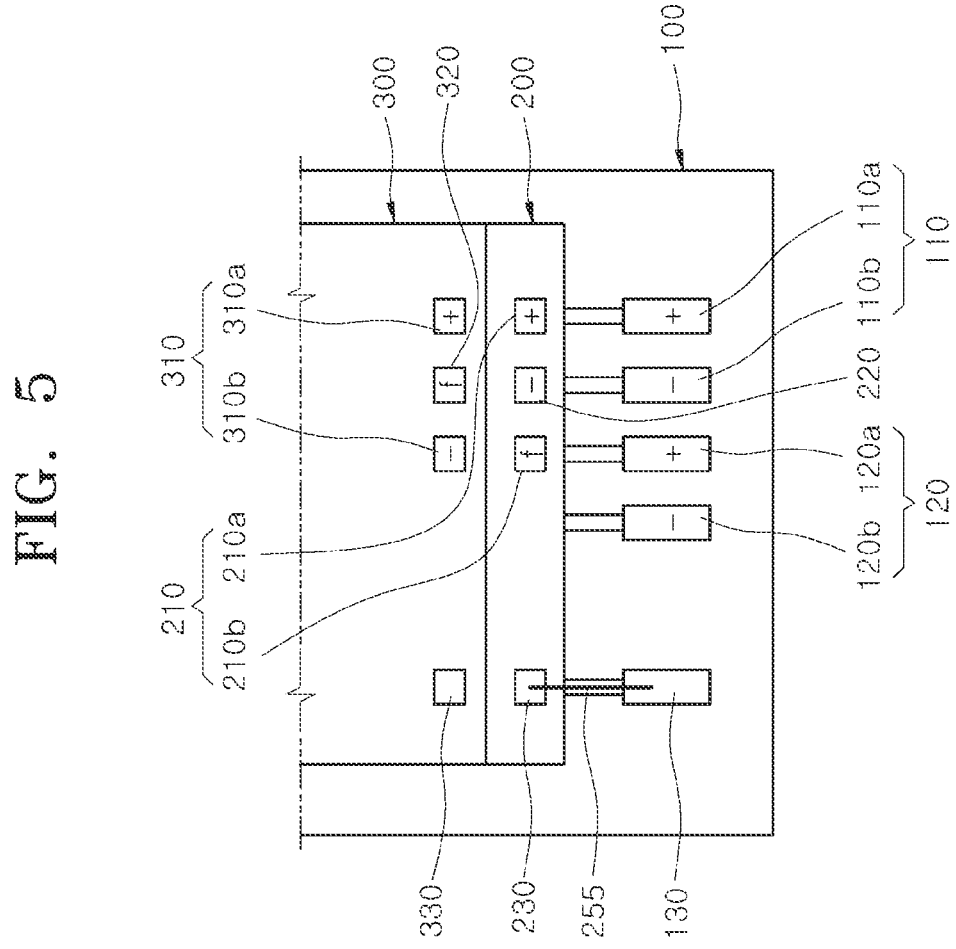
FIG. 5 is a diagram illustrating signal input/output at pads of a semiconductor chip according to an embodiment of the present disclosure.
Figure 5:
Figure 6:
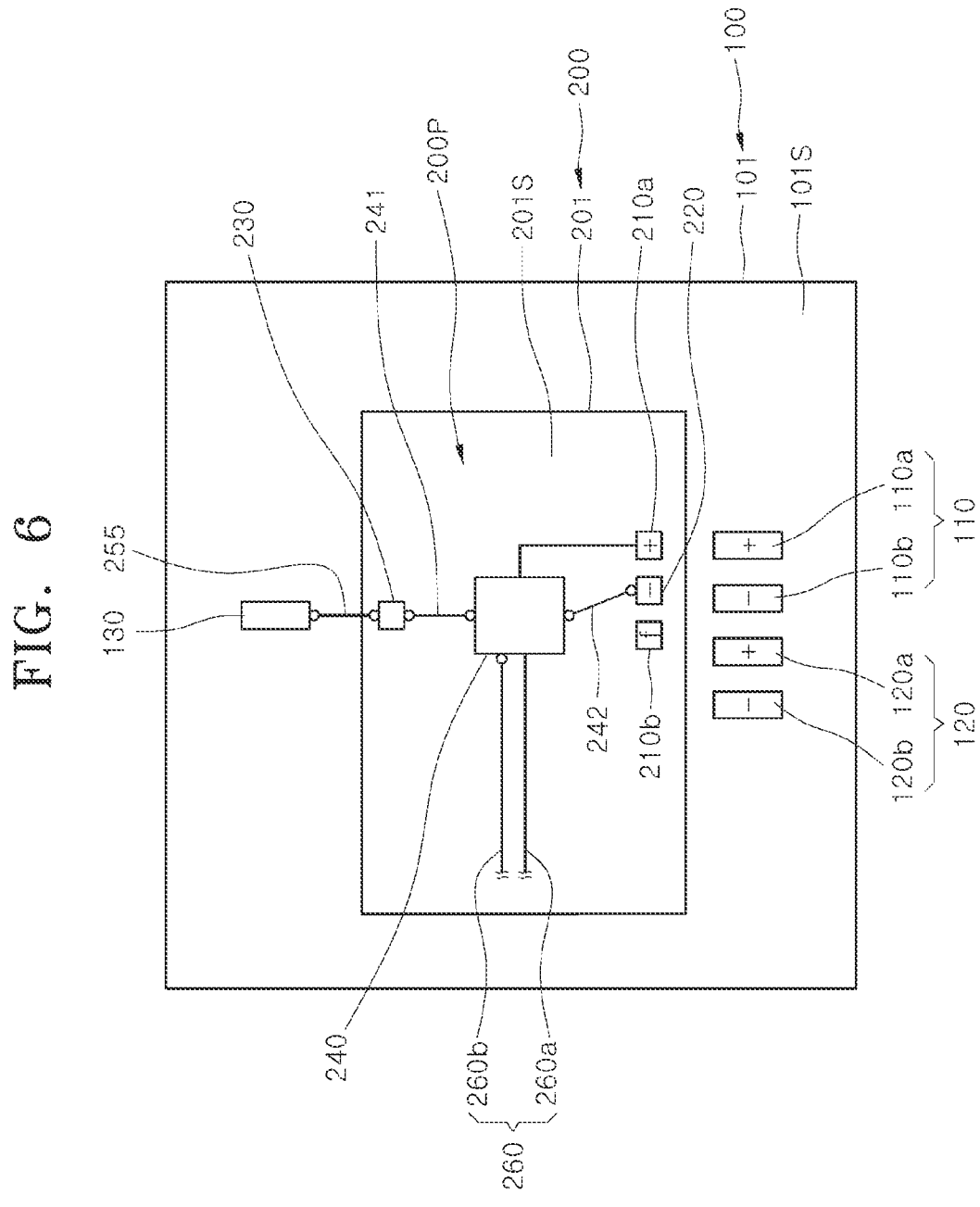
FIGS. 6 and 7 are views schematically illustrating a signal path control circuit of a semiconductor chip according to an embodiment of the present disclosure.
Figure 7:
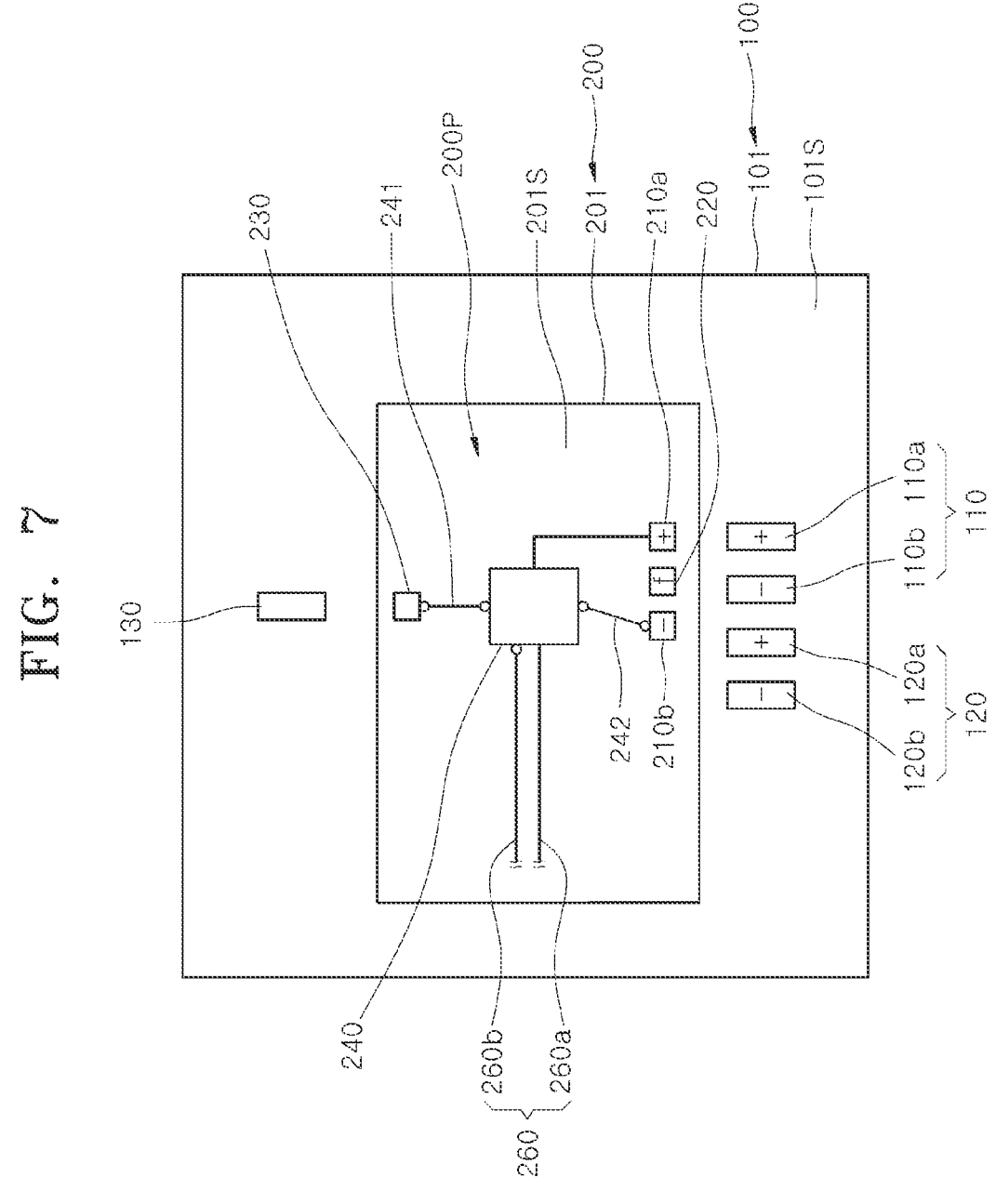
Figure 8:
FIG. 8 is a plan view schematically illustrating an arrangement of bonding wires between a semiconductor chip and a package substrate according to an embodiment of the present disclosure.
Figure 9:
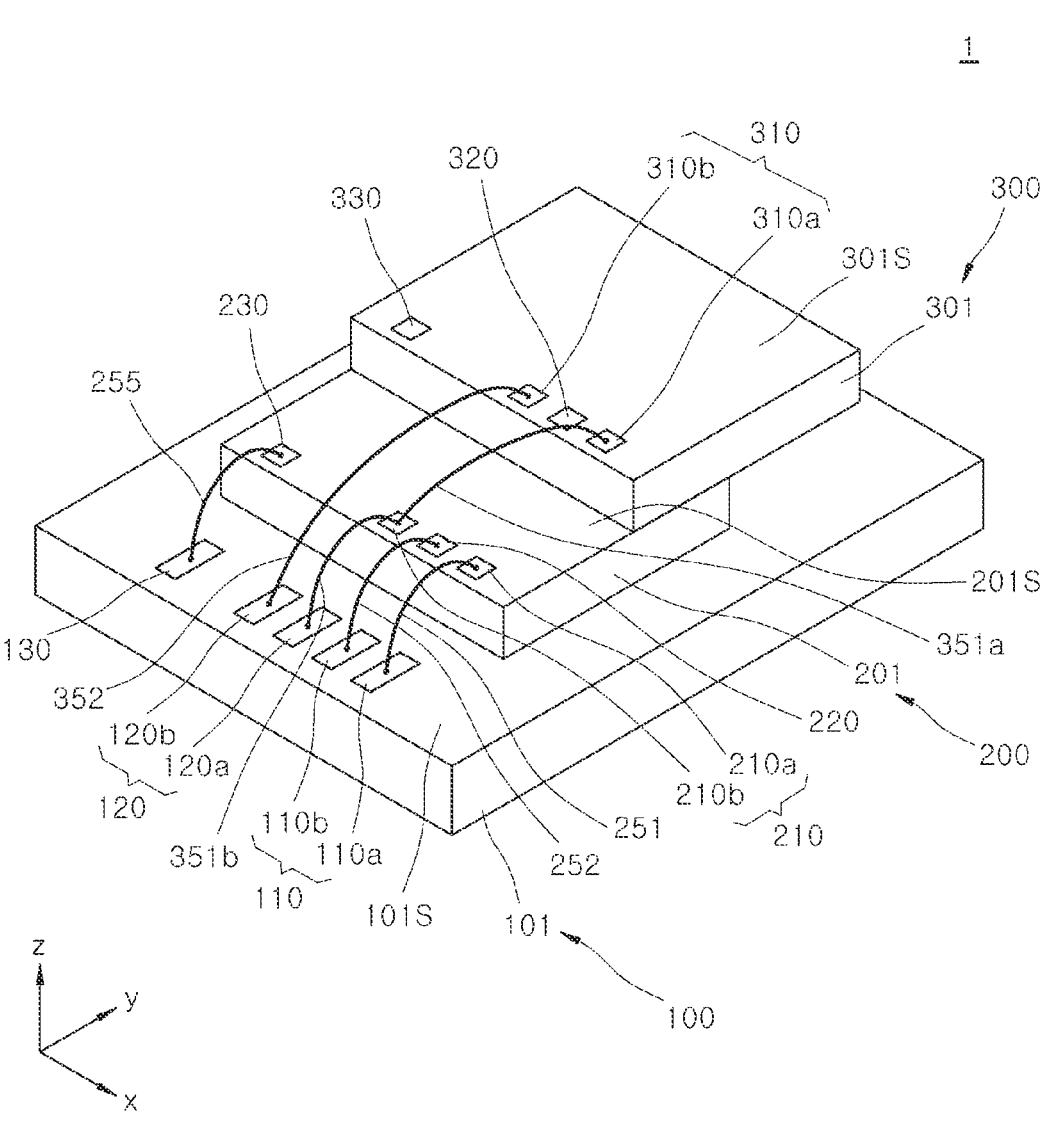
FIG. 9 is an isometric view schematically illustrating a semiconductor package including an arrangement of bonding wires between a semiconductor chip and a package substrate according to an embodiment of the present disclosure.

FIGS. 4 to 9 are views schematically illustrating a semiconductor package 1 according to an embodiment of the present disclosure. Specifically, FIG. 4 is a plan view schematically illustrating pad configurations of a semiconductor chip and a package substrate according to an embodiment of the present disclosure. FIG. 5 is a view illustrating signal input/output at pads of the semiconductor chip according to an embodiment of the present disclosure. FIGS. 6 and 7 are views schematically illustrating a signal path control circuit of the semiconductor chip according to an embodiment of the present disclosure. FIG. 8 is a plan view schematically illustrating an arrangement of bonding wires between the semiconductor chip and the package substrate according to an embodiment of the present disclosure. FIG. 9 is an isometric view schematically illustrating the semiconductor package 1 including an arrangement of bonding wires between the semiconductor chip and the package substrate according to an embodiment of the present disclosure.

Referring to FIG. 4, the semiconductor package 1 may include a package substrate 100, a first semiconductor chip 200 disposed on the package substrate 100, and a second semiconductor chip 300 disposed on the first semiconductor chip 200. The second semiconductor chip 300 may be stacked in a z-direction to be offset in a y-direction with respect to the first semiconductor chip 200.

The package substrate 100 may include a substrate body 101. The substrate body 101 may include a plurality of circuit pattern layers (not shown) applied to signal exchange between the first and second semiconductor chips 200 and 300 and an external system to which the semiconductor package 1 is connected, and vias electrically connecting the plurality of circuit pattern layers to each other. In addition, the substrate body 101 may include insulating layers that insulate the plurality of circuit pattern layers from each other.

First and second differential pair bond fingers 110 and 120 may be disposed on a surface 101S of the substrate body 101. In addition, first and second differential pair signal traces 140 and 150 electrically connected to the first and second differential pair bond fingers 110 and 120, respectively, may be arranged on the surface 101S of the substrate body 101. The first and second differential pair signal traces 140 and 150 may be electrically connected to external connection structures disposed on an opposite surface to the surface 101S of the substrate body 101 through wirings (not shown) of the substrate body 101. When the external connection structures of the package substrate 100 communicate with the external system, the package substrate 100 and the external system may exchange differential pair signals with each other.

The first differential pair bond fingers 110 may include a first true signal bond finger 110a and a first complementary signal bond finger 110b disposed adjacent to each other. In addition, the second differential pair bond fingers 120 may include a second true signal bond finger 120a and a second complementary signal bond finger 120b disposed adjacent to each other.

The first differential pair signal traces 140 may include a first true signal trace 140a and a first complementary signal trace 140b disposed adjacent to each other. The second differential pair signal traces 150 may include a second true signal trace 150a and a second complementary signal trace 150b disposed adjacent to each other.

A power bond finger 130 may be disposed on the surface 101S of the substrate body 101 to be spaced apart from the first and second differential pair bond fingers 110 and 120. In addition, a power trace 160 electrically connected to the power bond finger 130 may be disposed on the surface 101S of the substrate body 101. The power trace 160 may be electrically connected to external connection structures disposed on the opposite surface of the surface 101S of the substrate body 101 through a wiring (not shown) of the substrate body 101. As the external connection structures are connected to the external system, power may reach the power bond finger 130 from the external system.

Referring to FIG. 4, the first semiconductor chip 200 may include a first chip body 201 including integrated circuits. First differential pair signal pads 210 may be disposed on a surface 201S of the first chip body 201. The first differential pair signal pads 210 may include a first true signal pad 210a and a first complementary signal pad 210b.

A first option signal pad 220 may be disposed on the surface 201S of the first chip body 201 adjacent to the first differential pair signal pads 210. In an embodiment, the first option signal pad 220 may be disposed between the first true signal pad 210a and the first complementary signal pad 210b. Although not shown, each of the first true signal pad 210a, the first complementary signal pad 210b, and the first option signal pad 220 may be respectively connected to different signal lines.

A first control signal pad 230 may be disposed on the surface 201S of the first chip body 201 to be spaced apart from the first differential pair signal pads 210. As will be described later in connection with FIG. 6, when the first control signal pad 230 is electrically activated, the electrical connection between the first complementary signal pad 210b and the first complementary signal line of the first semiconductor chip 200 may be cut off, and the first complementary signal line of the first semiconductor chip 200 may be electrically connected to the first option signal pad 220. Accordingly, the signal path of the first complementary signal of the first semiconductor chip 200 may be changed to reach the first option signal pad 220.

Referring to FIG. 4, the second semiconductor chip 300 may include a second chip body 301 including integrated circuits. Second differential pair signal pads 310 may be disposed on a surface 301S of the second chip body 301. The second differential pair signal pads 310 may include a second true signal pad 310a and a second complementary signal pad 310b.

A second option signal pad 320 may be disposed adjacent to the second differential pair signal pads 310 on the surface 301S of the second chip body 301. In an embodiment, the second option signal pad 320 may be disposed between the second true signal pad 310a and the second complementary signal pad 310b. Although not shown, the second true signal pad 310a, the second complementary signal pad 310b, and the second option signal pad 320 may be respectively connected to different signal lines.

A second control signal pad 330 may be disposed on the surface 301S of the second chip body 301 to be spaced apart from the second differential pair signal pads 310. As will be described later in connection with FIG. 6, when the second control signal pad 330 is electrically activated, the electrical connection between the second complementary signal pad 310b and the second complementary signal line of the second semiconductor chip 300 may be cut off, and the second complementary signal line of the second semiconductor chip 300 may be electrically connected to the second option signal pad 320. Accordingly, the signal path of the second complementary signal of the second semiconductor chip 300 may be changed to reach the second option signal pad 320.

In the plan view of FIG. 4, the first true signal pad 210*a* of the first semiconductor chip 200 and the second true signal pad 310*a* of the second semiconductor chip 300 may be aligned with each other in the y-direction, the first complementary signal pad 210*b* of the first semiconductor chip 200 and the second complementary signal pad 310*b* of the second semiconductor chip 300 may be aligned with each other in the y-direction, and the first option signal pad 220 of the first semiconductor chip 200 and the second option signal pad 320 of the second semiconductor chip 300 may be aligned with each other in the y-direction.

Referring to FIG. 5, when the first control signal pad 230 of the first semiconductor chip 200 is electrically activated, the electrical connection between the first complementary signal pad 210*b* and the first complementary signal line of the first semiconductor chip 200 may be cut off, and the first complementary signal line of the first semiconductor chip 200 may be electrically connected to the first option signal pad 220. Accordingly, the signal path of the first complementary signal of the first semiconductor chip 200 may be changed to reach the first option signal pad 220. As the signal path of the first complementary signal of the first semiconductor chip 200 is changed, the first complementary signal pad 210*b* may be converted into a dummy pad. That is, the first complementary signal pad 210*b* may be electrically disconnected from the signal path with the first semiconductor chip 200. In FIG. 5, for convenience of description, 'f' is denoted on dummy pads. According to the change of the signal path, the first true signal pad 210*a* and the first option signal pad 220 may input and output differential pair signals of the first semiconductor chip 200.

The electrical activation of the first control signal pad 230 may be achieved by wire-bonding the first control signal pad 230 to the power bonding finger 130 of the package substrate 100. As shown in FIG. 5, the first control signal pad 230 may receive the power supplied to the power bond finger 130 from the external system through a first control signal wire 255, so that the first control signal pad 230 may be electrically activated.

Referring to FIG. 5, the second control signal pad 330 of the second semiconductor chip 300 might not be electrically connected to the power bond finger 130 of the package substrate 100, so that the second control signal pad 330 may be electrically deactivated. In this case, the second option signal pad 320 may function as a dummy pad that is electrically disconnected from the signal path with the first semiconductor chip 100. Accordingly, the second true signal pad 310*a* and the second complementary signal pad 310*b* may be respectively connected to the differential pair signal lines of the second semiconductor chip 300, and the second true signal pad 310*a* and the second complementary signal pad 310*b* may input and output the differential pair signals of the second semiconductor chip 300.

Although FIG. 5 illustrates a signal path change of the first semiconductor chip 200 between the first complementary signal pad 210*b* and the first option signal pad 220 of the first semiconductor chip 200, the scope and spirit of the present disclosure are not necessarily limited thereto. In another embodiment, the change of the signal path between the first true signal pad 210*a* and the first option signal pad 220 of the first semiconductor chip 200 may be implemented according to the electrical activation of the first control signal pad 230. The method of changing the signal path will be described below with reference to FIGS. 6 and 7.

In the embodiment of FIG. 5, the path change is performed with respect to any one of the differential pair signal lines of the first semiconductor chip 200 by using the first option signal pad 220, and the path change of the differential pair signal lines is not performed for the second semiconductor chip 300. However, in some embodiments not shown in FIG. 5, the path change of the differential pair signal lines in the first semiconductor chip 200 is not performed, and a path change may be performed with respect to any one of the differential pair signal lines by using the second option signal pad 320 in the second semiconductor chip 300. In this case, the first control signal pad 230 of the first semiconductor chip 200 might not be electrically connected to the power bond finger 130 of the package substrate 100, and the second control signal pad 330 of the second semiconductor chip 300 may be connected to the power bond finger 130 by wire-bonding. In addition, in some embodiments not shown in FIG. 5, the first and second control signal pads 230 and 330 of the first and second semiconductor chips 200 and 300 may be respectively wire-bonded to the power bond finger 130 of the package substrate 100. Accordingly, a path change may be performed with respect to any one of the differential pair signal lines of each of the first and second semiconductor chips 200 and 300.

Figure 10:
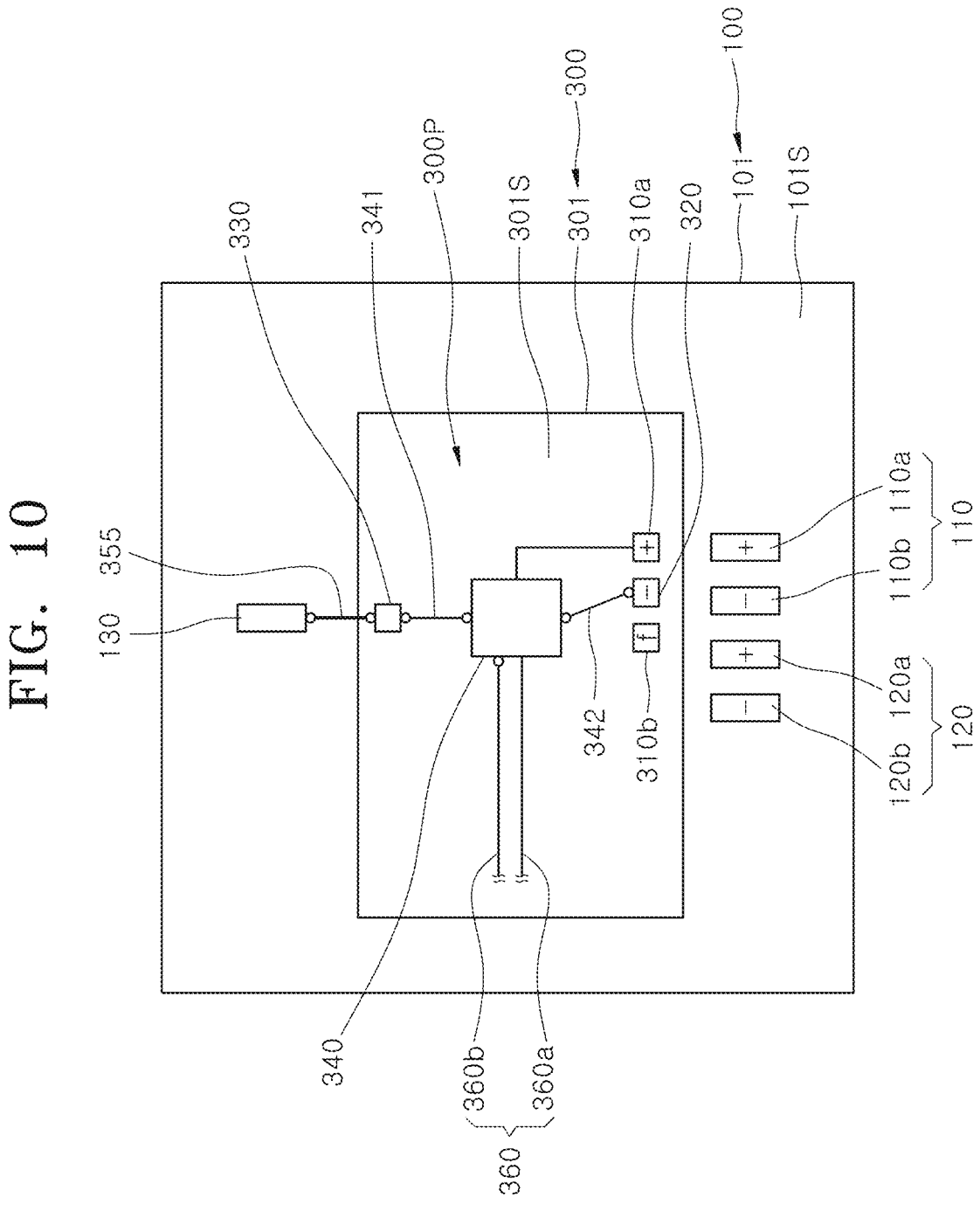
Figure 11:
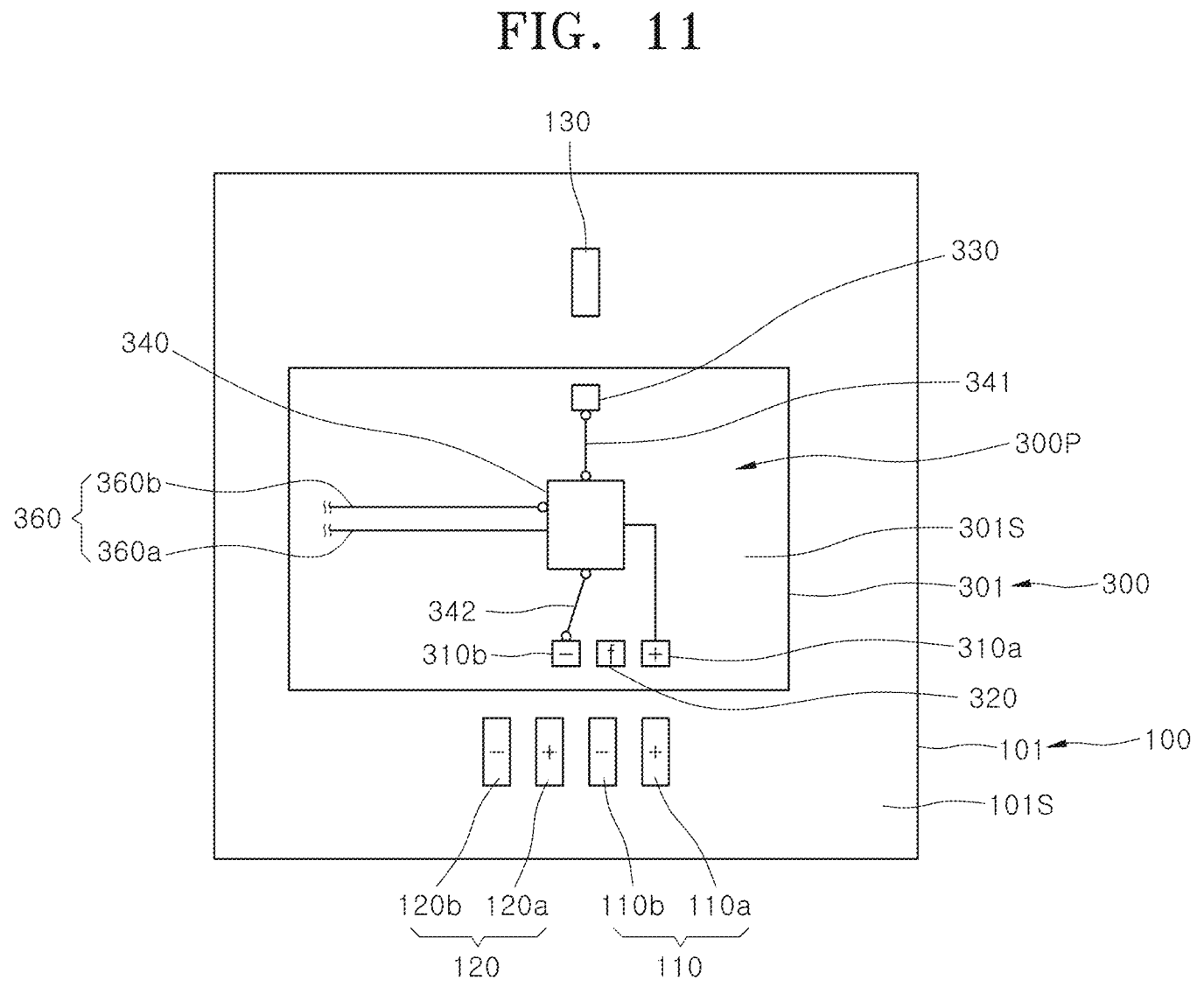

Referring to FIGS. 6 and 7, the first semiconductor chip 200 may include a signal path control circuit 200P. Although not shown in FIGS. 6 and 7, the second semiconductor chip 300 may also include a signal path control circuit. The configuration and operation of the signal path control circuit of the second semiconductor chip 300 may be substantially the same as the configuration and operation of the signal path control circuit 200P of the first semiconductor chip 200. FIGS. 10 and 11 schematically illustrates a signal path control circuit 300P of the second semiconductor chip 300.

Referring to FIG. 6, the signal path control circuit 200P may include an electrical switch 240 that controls signal input and output of the first differential pair signal pads 210*a* and 210*b* and the first option signal pad 220. The electrical switch 240 may be electrically connected to the first control signal pad 230 through a control signal input line 241. In addition, the electrical switch 240 may be electrically connected to a complementary signal line 260*b* of differential pair signal lines 260.

When the electrical switch 240 receives a control signal from the first control signal pad 230, the electrical switch 240 may electrically connect the complementary signal line 260*b* to the first option signal pad 220 using a signal output line 242. In this case, the first complementary signal pad 210*b* may be electrically disconnected from the first complementary signal line 260*b*. In addition, the first complementary signal pad 210*b* may be converted into a dummy pad whose electrical connection with the signal lines of the first semiconductor chip 200 is disconnected. Meanwhile, a true signal line 260*a* of the differential pair signal lines 260 may be electrically connected to the first true signal pad 210*a*.

Meanwhile, the first semiconductor chip 200 may include differential pair signals that move along the differential pair signal lines 260. The differential pair signals may include a true signal and a complementary signal. According to an embodiment of the present disclosure, the true signal that moves along the true signal line 260*a* of the first semiconductor chip 200 may reach the first true signal pad 210*a*, and the complementary signal that is transmitted along the complementary signal line 260*b* may reach the first option signal pad 220 via the electrical switch 240.

The control signal may be transmitted from the first control signal pad 230 when the first control signal pad 230 is electrically activated. As mentioned above, the first control signal pad 230 and the power bond finger 130 may be connected to each other by a first control signal wire 255, and the first control signal pad 230 may receive power from the power bond finger 130, thereby achieving the electrical activation of the first control signal pad 230.

Referring to FIG. 7, when the first control signal pad 230 and the power bond finger 130 are not connected to each other, the first control signal pad 230 may be electrically deactivated. In this case, the control signal might not be transmitted from the first control signal pad 230 to the electrical switch 240.

When the electrical switch 240 does not receive the control signal from the first control signal pad 230, the electrical switch 240 may electrically connect the complementary signal line 260b to the first complementary signal pad 210b. The first option signal pad 220 may maintain the state of being electrically disconnected from the complementary signal line 260b. In addition, the first option signal pad 220 may function as a dummy pad whose electrical connection with the signal lines of the first semiconductor chip 200 is disconnected. Accordingly, the true signal that is transmitted along the true signal line 260a of the first semiconductor chip 200 may reach the first true signal pad 210a, and the complementary signal that is transmitted along the complementary signal line 260b may reach the first complementary signal pad 210b via the electrical switch 240.

FIGS. 6 and 7 disclose an embodiment in which the electrical switch 240 changes the signal path between the complementary signal line 260b of the differential pair signal lines 260 and the first complementary signal pad 210b to the signal path between the complementary signal line 260b and the first option signal pad 220, according to whether the control signal is received. However, the scope and spirit of the present disclosure is not necessarily limited thereto. In some embodiments not shown in FIGS. 6 and 7, the electrical switch 240 may change the signal path between the true signal line 260a of the differential pair signal lines 260 and the first true signal pad 210a to the signal path between the true signal line 260a and the first option signal pad 220, according to whether the control signal is received. In this case, the complementary signal line 260b may be electrically connected to the first complementary signal pad 210b.

Referring to FIG. 10, the signal path control circuit 300P may include an electrical switch 340 that controls signal input and output of the second differential pair signal pads 310a and 310b and the second option signal pad 320. The electrical switch 340 may be electrically connected to the second control signal pad 330 through a control signal input line 341. In addition, the electrical switch 340 may be electrically connected to a complementary signal line 360b of differential pair signal lines 360.

When the electrical switch 340 receives a control signal from the second control signal pad 330, the electrical switch 340 may electrically connect the complementary signal line 360b to the second option signal pad 320 using a signal output line 342. In this case, the second complementary signal pad 310b may be electrically disconnected from the second complementary signal line 360b. In addition, the second complementary signal pad 310b may be converted into a dummy pad whose electrical connection with the signal lines of the second semiconductor chip 300 is disconnected. Meanwhile, a true signal line 360a of the differential pair signal lines 360 may be electrically connected to the first true signal pad 310a.

Meanwhile the second semiconductor chip 300 may include differential pair signals that move along the differential pair signal lines 360. The differential pair signals may include a true signal and a complementary signal. According to an embodiment of the present disclosure, the true signal that moves along the true signal line 360a of the second semiconductor chip 300 may reach the first true signal pad 310a, and the complementary signal that is transmitted along the complementary signal line 360b may reach the first option signal pad 320 via the electrical switch 340.

The control signal may be transmitted from the second control signal pad 330 when the second control signal pad 330 is electrically activated. As mentioned above the second control signal pad 330 and the power bond finger 130 may be connected to each other by a second control signal wire 355, and the second control signal pad 330 may receive power from the power bond finger 130, thereby achieving the electrical activation of the first control signal pad 330.

Referring to FIG. 11, when the second control signal pad 330 and the power bond finger 130 are not connected to each other the second control signal pad 330 may be electrically deactivated. In this case, the control signal might not be transmitted from the first control signal pad 330 to the electrical switch 340.

When the electrical switch 340 does not receive the control signal from the second control signal pad 330, the electrical switch 340 may electrically connect the complementary signal line 360b to the second complementary signal pad 310b. The second option signal pad 320 may maintain the state of being electrically disconnected from the complementary signal line 360b. In addition, the second option signal pad 320 may function as a dummy pad whose electrical connection with the signal lines of the second semiconductor chip 300 is disconnected. Accordingly, the true signal that is transmitted along the true signal line 360a of the second semiconductor chip 300 may reach the second true signal pad 310a, and the complementary signal that is transmitted along the complementary signal line 360b may reach the second complementary signal pad 310b via the electrical switch 340.

FIG. 8 schematically illustrates an arrangement of bonding wires between the semiconductor chips and the package substrate according to an embodiment of the present disclosure. FIG. 9 schematically illustrates a semiconductor package including the arrangement of the bonding wires according to an embodiment of the present disclosure.

As described above with reference to FIG. 5, in the first semiconductor chip 200 of FIG. 8, the first control signal pad 230 may be electrically activated, so that the first true signal pad 210a and the first option signal pad 220 may input and output differential pair signals of the first semiconductor chip 200. In this case, the first complementary signal pad 210b may function as a dummy pad.

On the other hand, in the second semiconductor chip 300, as described above with reference to FIG. 5, the second control signal pad 330 may be electrically deactivated, so that the second true signal pad 310a and the second complementary signal pad 320b may input and output differential pair signals of the second semiconductor chip 300. In this case, the second option signal pad 320 may function as a dummy pad.

Referring to FIGS. 8 and 9, the first true signal pad 210a of the first semiconductor chip 200 may be bonded to the first true signal bond finger 110a of the package substrate 100 by a first true signal wire 251. The first option signal pad 220 of the first semiconductor chip 200 may be bonded to the first complementary signal bond finger 110b of the package substrate 100 by a first complementary signal wire 252.

The second true signal pad 310a of the second semiconductor chip 300 may be bonded to the second true signal bond finger 120a of the package substrate 100 by second true signal wires 351a and 351b. In this case, the second true signal wires 351a and 351b may pass through the first complementary signal pad 210b. Specifically, the upper wire 351a of the second true signal wires 351a and 351b may connect the second true signal pad 310a to the first complementary signal pad 210b, and the lower wire 351b of the second true signal wires 351a and 351b may connect the first complementary signal pad 210b to the second true signal bond finger 120a.

In this case, as shown in FIGS. 8 and 9, the first and second true signal wires 251, 351a, and 351b and the first and second complementary signal wires 252 and 352 may be arranged so as not to cross each other. That is, a sufficient distance may be secured between the first and second true signal wires 251, 351a, and 351b and the first and second complementary signal wires 252 and 352.

In FIG. 8, the second true signal wires 351a and 351b are disposed to pass through the first complementary signal pad 210b, but the scope and spirit of the present disclosure are not limited thereto. Instead of the second true signal wires 351a and 351b, another signal wire may be disposed to pass through the first complementary signal pad 210b, which is a dummy pad. As an example, a single second true signal wire may directly connect the second true signal pad 310a and the second true signal bond finger 120a, and a second complementary signal wire 352 may be arranged to reach the second complementary signal bond finger 120b from the second complementary signal pad 310b via the first complementary signal pad 210b.

Meanwhile, referring to FIG. 8 again, the first differential pair bond fingers 110 of the package substrate 100 may be disposed adjacent to each other. That is, the first true signal bonding finger 110a and the first complementary signal bonding finger 110b may be disposed adjacent to each other. Likewise, the second differential pair bond fingers 120 may be disposed adjacent to each other. That is, the second true signal bonding finger 120a and the second complementary signal bonding finger 120b may be disposed adjacent to each other. Accordingly, as shown in FIG. 4, the first true signal trace 140a and the first complementary signal trace 140b respectively extending from the first true signal bonding finger 110a and the first complementary signal bonding finger 110b may be disposed adjacent to each other. As a result, the differential pair signals of the first semiconductor chip 200 may be transmitted from the package substrate 100 according to the differential mode signal transmission method.

In addition, as shown in FIG. 4, the second true signal trace 150a and the first complementary signal trace 150b respectively extending from the second true signal bonding finger 120a and the second complementary signal bonding finger 120b may be adjacent to each other. As a result, the differential pair signals of the second semiconductor chip 300 may be transmitted from the package substrate 100 according to the differential mode signal transmission method.

As described above, according to an embodiment of the present application, any one of the signal paths to the differential pair signal pads that are electrically connected to the differential pair signal line in the semiconductor chip may be changed to a signal path to the option pad. The changing of one of the differential pair signal pads may improve the efficiency of the wire bonding process and the structural reliability of the bonding wire. In addition, the change of one of the differential pair signal pads might not require a design change for an additional differential pair signal trace so that the differential pair signals are transmitted according to the differential mode signal transmission method in the package substrate. As a result, it is possible to provide a semiconductor package with improved signal transmission efficiency and reliability.

Meanwhile, in the semiconductor package 1 described above with reference to FIGS. 4 to 9, the first and second semiconductor chips 200 and 300 are stacked on the package substrate 100, but the matters of the present disclosure might not be necessarily limited thereto. At least three semiconductor chips having substantially the same configuration as the first semiconductor chip 200 may be stacked on the package substrate 100 to be offset in one direction. Alternatively, one semiconductor chip having substantially the same configuration as the first semiconductor chip 200 may be disposed on the package substrate 100.

The present teachings been disclosed in conjunction with some embodiments as described above. Those skilled in the art will appreciate that various modifications, additions, and/or substitutions are possible, without departing from the scope and spirit of the present disclosure. Accordingly, the embodiments disclosed in the present specification should be considered from not a restrictive standpoint but an illustrative standpoint. The scope of the present teachings is not limited to the above descriptions but defined by the accompanying claims, and all of distinctive features in the equivalent scope should be construed as being included in the present teachings.

What is claimed is:

1. A semiconductor package comprising:
a package substrate;
a first semiconductor chip disposed on the package substrate and wire-bonded to the package substrate; and
a second semiconductor chip stacked on the first semiconductor chip and wire-bonded to the package substrate,
wherein the first semiconductor chip includes first differential pair signal pads, a first option signal pad disposed adjacent to the first differential pair signal pads, and a first signal path control circuit for controlling signal input/output of the first differential pair signal pads and the first option signal pad,
wherein the second semiconductor chip includes second differential pair signal pads, a second option signal pad disposed adjacent to the second differential pair signal pads, and a second signal path control circuit for controlling signal input/output of the second differential pair signal pads and the second option signal pad,
wherein the first signal path control circuit is configured to change a signal path of one of differential pair signals of the first semiconductor chip by a first control signal, and a pad to which the one of the differential pair signals reaches is changed from one of the first differential pair signal pads to the first option signal pad, along the changed signal path,
wherein according to the changed signal path of the first semiconductor chip, the first option signal pad outputs the one of the differential pair signals of the first semiconductor chip into the package substrate through a first signal wire,
wherein the second signal path control circuit is configured to change a signal path of one of differential pair signals of the second semiconductor chip by a second control signal, and a pad to which the one of the differential pair signals reaches is changed from one of the second differential pair signal pads to the second option signal pad, along the changed signal path, and wherein according to the changed signal path of the second semiconductor chip, the second option signal pad outputs the one of the differential pair signals of the second semiconductor chip into the package substrate through a second signal wire.

2. The semiconductor package of claim 1, wherein when the signal path of the one of the differential pair signals of the first semiconductor chip is changed, the one of the first differential pair signal pads is converted into a dummy pad, and wherein when the signal path of the one of the differential pair signals of the second semiconductor chip is changed, the one of the second differential pair signal pads is converted into a dummy pad.

3. The semiconductor package of claim 1, wherein the first signal path control circuit includes a first electrical switch that electrically connects one of first differential pair signal lines to the first option signal pad according to the first control signal, and wherein the second signal path control circuit includes a second electrical switch that electrically connects one of second differential pair signal lines to the second option signal pad according to the second control signal.

4. The semiconductor package of claim 1, wherein the first semiconductor chip further includes a first control signal pad that is spaced apart from the first differential pair signal pads, wherein the second semiconductor chip further includes a second control signal pad that is spaced apart from the second differential pair signal pad, wherein the first signal path control circuit receives the first control signal according to electrical activation of the first control signal pad, and wherein the second signal path control circuit receives the second control signal according to electrical activation of the second control signal pad.

5. The semiconductor package of claim 4, wherein the package substrate includes a power bond finger that is disposed on a substrate body of the package substrate and is wire-bonded to at least one of the first and second control signal pads, and wherein the at least one of the first and second control signal pads is electrically activated by wire-bonding with the power bond finger.

6. The semiconductor package of claim 5, wherein the at least one of the first and second control signal pads is electrically activated by power provided from the power bond finger.

7. The semiconductor package of claim 4, wherein one of the first and second control signal pads is electrically activated, and the other is electrically deactivated.

8. The semiconductor package of claim 1, wherein the package substrate includes first differential pair bond fingers and second differential pair bond fingers disposed adjacent to each other.

9. The semiconductor package of claim 8, wherein the package substrate further includes:
first differential pair signal traces electrically coupled to the first differential pair bond fingers; and
second differential pair signal traces electrically coupled to the second differential pair bond fingers.

10. The semiconductor package of claim 8, wherein the first differential pair bond fingers include a first true signal bond finger and a first complementary signal bond finger disposed adjacent to each other, wherein the second differential pair bond fingers include a second true signal bond finger and a second complementary signal bond finger disposed adjacent to each other, wherein the first differential pair signal pads include a first true signal pad and a first complementary signal pad, wherein the second differential pair signal pads include a second true signal pad and a second complementary signal pad, wherein the first true signal pad and the second true signal pad are aligned with each other in a direction, wherein the first complementary signal pad and the second complementary signal pad are aligned with each other in the direction, and wherein the first option signal pad and the second option signal pad are aligned with each other in the direction.

11. The semiconductor package of claim 10, wherein the signal path of the first semiconductor chip is changed, and the signal path of the second semiconductor chip is not changed, wherein the first true signal pad is bonded to the first true signal bond finger by a first true signal wire, wherein the first option signal pad is bonded to the first complementary signal bond finger by a first complementary signal wire, wherein the second true signal pad is bonded to the second true signal bonding finger by a second true signal wire, and wherein the second complementary signal pad is bonded to the second complementary signal bond finger by a second complementary signal wire.

12. The semiconductor package of claim 11, wherein the first complementary signal pad is a dummy pad that is electrically disconnected from the signal path of the first semiconductor chip.

13. The semiconductor package of claim 11, wherein one of the second true signal wire and the second complementary signal wire passes through the first complementary signal pad.

14. A semiconductor package comprising:
a package substrate; and
a semiconductor chip disposed on the package substrate and wire-bonded to the package substrate, wherein the package substrate includes differential pair bond fingers disposed on a substrate body of the package substrate, wherein the semiconductor chip includes differential pair signal pads disposed on a chip body of the semiconductor chip, an option signal pad disposed adjacent to the differential pair signal pads, a control signal pad disposed on the chip body to be spaced apart from the differential pair signal pads, and a signal path control circuit, and wherein the signal path control circuit is configured to change a signal path between one of differential pair signal lines of the semiconductor chip and one of the differential pair signal pads to a signal path between the one of the differential pair signal lines of the semiconductor chip and the option signal pad, according to electrical activation of the control signal pad, and wherein according to the changed signal path of the semiconductor chip, the option signal pad outputs a signal that come from the one of the differential pair lines of the semiconductor chip into the package sub-
strate through a signal wire.

15. The semiconductor package of claim 14, wherein the
package substrate further includes differential pair signal
traces electrically connected to the differential pair bond
fingers on the substrate body.

16. The semiconductor package of claim 14, wherein the
package substrate further includes a power bond finger
disposed on the substrate body and wire-bonded to the
control signal pad.

17. The semiconductor package of claim 16, wherein the
control signal pad is electrically activated by wire-bonding
of the power bond finger and the control signal pad.

18. The semiconductor package of claim 14, wherein the
one of the differential pair signal pads is converted into a
dummy pad by electrical activation of the control signal pad.

19. The semiconductor package of claim 14, wherein by
the electrical activation of the control signal pad, the other
one of the differential pair signal pads and the option signal
pad are wire-bonded to the differential pair bond fingers.

20. The semiconductor package of claim 14, wherein the
signal path control circuit includes an electrical switch that
electrically connects one of the differential pair signal lines
to the option signal pad according to a control signal
transmitted from the control signal pad.

\* \* \* \* \*